(12) United States Patent  
Kasha et al.

(10) Patent No.: US 11,749,712 B2
(45) Date of Patent: *Sep. 5, 2023

(54) HIGH DIELECTRIC CONSTANT MATERIAL AT LOCATIONS OF HIGH FIELDS

(71) Applicant: Skyworks Solutions, Inc., Irvine, CA (US)

(72) Inventors: Dan B. Kasha, Seattle, WA (US); Russell Croman, Buda, TX (US); Stefan N. Mastovich, Round Rock, TX (US); Thomas C. Fowler, Georgetown, TX (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/556,258

(22) Filed: Dec. 20, 2021

(65) Prior Publication Data

US 2022/0115497 A1 Apr. 14, 2022

Related U.S. Application Data

(63) Continuation of application No. 16/726,477, filed on Dec. 24, 2019, now Pat. No. 11,205,696.

(51) Int. Cl.
*H01L 23/00* (2006.01)
*H01L 49/02* (2006.01)

(52) U.S. Cl.
CPC .............. *H01L 28/60* (2013.01); *H01L 24/48* (2013.01); *H01L 24/85* (2013.01); *H01L 2224/48265* (2013.01); *H01L 2924/19104* (2013.01)

(58) Field of Classification Search
CPC ......... H01L 28/60; H01L 24/48; H01L 24/85; H01L 2224/48265; H01L 2924/19104
See application file for complete search history.

(56) References Cited

U.S. PATENT DOCUMENTS

| | | | |
|---|---|---|---|
| 7,732,301 | B1 | 6/2010 | Pinnington et al. |
| 8,802,504 | B1 | 8/2014 | Hou et al. |
| 8,890,223 | B1 | 11/2014 | Bonifield et al. |
| 9,299,697 | B2 | 3/2016 | West et al. |
| 9,583,558 | B2 | 2/2017 | West et al. |
| 9,768,245 | B2 | 9/2017 | West et al. |
| 10,147,784 | B2 | 12/2018 | West et al. |
| 2008/0277761 | A1 | 11/2008 | Mahalingam et al. |

(Continued)

*Primary Examiner* — Timor Karimy
(74) *Attorney, Agent, or Firm* — Knobbe, Martens, Olson & Bear, LLP

(57) ABSTRACT

An integrated circuit has an isolation capacitor structure that reduces the risk of breakdown from high electric fields at the edge of the top metal plate of the capacitor. The capacitor structure includes a bottom metal plate above a substrate. A first dielectric layer of a first dielectric material is formed between the bottom metal plate and the top metal plate. The capacitor structure also includes a thin narrow ring formed of a second dielectric material located under a portion of the top metal plate. The second dielectric material has a higher dielectric constant than the first dielectric material. The thin narrow ring follows the shape of the edge of the top metal plate with a portion of the ring underneath the top metal plate and a portion outside the edge of the top metal plate to thereby be located at a place of the maximum electric field.

19 Claims, 10 Drawing Sheets

(56) References Cited

U.S. PATENT DOCUMENTS

| | | |
|---|---|---|
| 2009/0124073 A1 | 5/2009 | Liu et al. |
| 2010/0167522 A1 | 7/2010 | Daubenspeck |
| 2011/0284843 A1* | 11/2011 | Chen ................... H01L 22/34 |
| | | 257/E23.151 |
| 2016/0172434 A1 | 6/2016 | West et al. |
| 2017/0263696 A1 | 9/2017 | West et al. |
| 2018/0332707 A1 | 11/2018 | Akahoshi et al. |
| 2019/0074350 A1 | 3/2019 | West et al. |
| 2019/0206981 A1 | 7/2019 | Bonifield et al. |
| 2020/0235197 A1 | 7/2020 | Sizov |
| 2021/0193791 A1 | 6/2021 | Kasha |
| 2021/0202375 A1 | 7/2021 | Fowler |

* cited by examiner

HIGH DIELECTRIC CONSTANT MATERIAL AT LOCATIONS OF HIGH FIELDS

CROSS-REFERENCE TO RELATED APPLICATION(S)

This application is a continuation of U.S. patent application Ser. No. 16/726,477, filed Dec. 24, 2019, entitled "High Dielectric Constant Material at Locations of High Fields," naming Dan B. Kasha, Russell Croman, Stefan N. Mastovich, and Thomas C. Fowler as inventors, which application is incorporated herein by reference in its entirety.

BACKGROUND

Field of the Invention

This application relates to capacitors and more particularly to capacitors used is isolation applications.

Description of the Related Art

Isolation communication channels are utilized in various applications where necessary to prevent current flow between separate isolated electric circuits while still maintaining communication between the circuits. The isolation may be required for signal isolation, safety, or for other reasons. The isolation communication channels may be implemented using capacitive techniques.

Referring to FIG. 1 a typical isolation capacitor 100 includes a top metal plate 101, a bottom metal plate 103 above a silicon substrate 105, and a region of insulator material such as SiO2 between the bottom metal plate and the top metal plate. A top dielectric layer 107 serves as a barrier to protect the integrated circuit from production damage. One or more additional passivation layers (not shown), are formed above the top dielectric 107. The isolation capacitor 100 allows for low voltage signaling, e.g., of approximately 1-3 volts for transfer of information (e.g., based on pulse width of the signal or other information in the signal). The bond wire 109 used in the low voltage signaling can experience large non-signal voltages from hundreds to even thousands of volts relative to the integrated circuit, which high voltages are also applied to the top plate. The SiO2 layer isolates the large non-signal voltages from the circuits coupled to the bottom plate of the capacitor that process the information transmitted in the low voltage signaling using the capacitor. However, under large voltages the SiO2 layer can break down, damaging the integrated circuit such that the integrated circuit is no longer usable. Accordingly, improved isolation techniques are desirable.

SUMMARY OF EMBODIMENTS OF THE INVENTION

In an embodiment, an integrated circuit includes a bottom conductive plate above a substrate. A first dielectric layer made of a first dielectric material is formed above the bottom conductive plate. A ring structure is formed of at least a second dielectric material that has a higher dielectric constant than the first dielectric material. The ring structure has an inner perimeter that is below a portion of the top conductive plate and an outer perimeter that is outside an edge of the top conductive plate.

In another embodiment a method of making an integrated circuit includes forming a bottom conductive plate above a substrate. A dielectric layer of at least a first dielectric material is formed above the bottom conductive plate. A ring structure of a second dielectric material having a higher dielectric constant than the first dielectric material is formed above the dielectric layer, the ring structure being formed with an inner perimeter and an outer perimeter. A top conductive plate is formed with the inner perimeter of the ring structure under a first portion of the top conductive plate such that a portion of a top surface of the ring structure is adjacent to the first portion of the top conductive plate and the outer perimeter of the ring structure extends beyond an edge of the top conductive plate.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
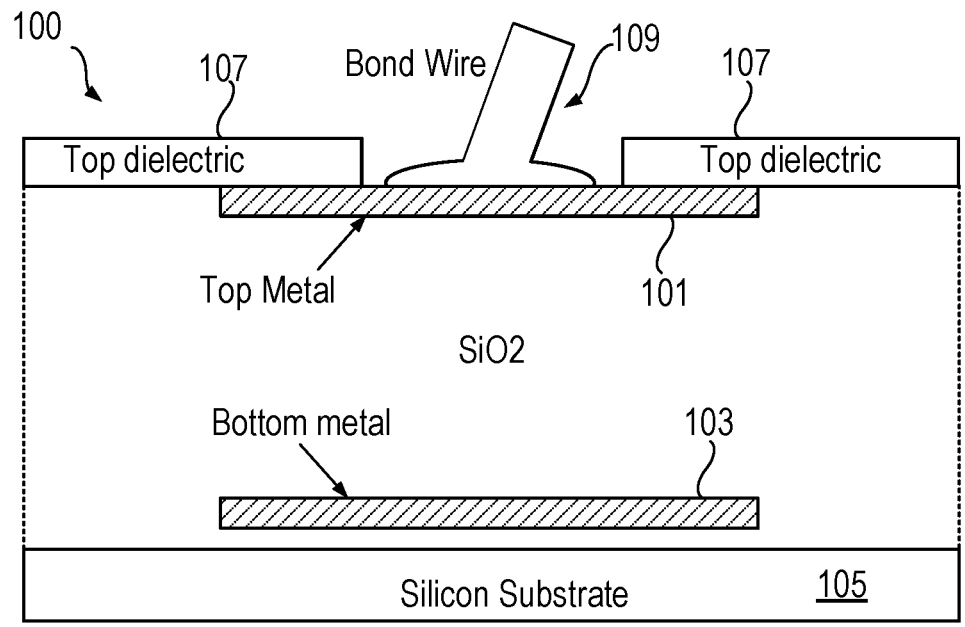
FIG. 1 illustrates a typical isolation capacitor structure.

Traditional isolation capacitors shown in FIG. 1 do not have the breakdown strength expected of a silicon dioxide dielectric due to peak fields that occur at the isolation capacitor plate edges. Embodiments described herein improve the breakdown strength of the insulating layer between the capacitor plates by modifying the fields at the capacitor plate edges in conjunction with using a material more suited to support the high fields that remain.

Figure 2:
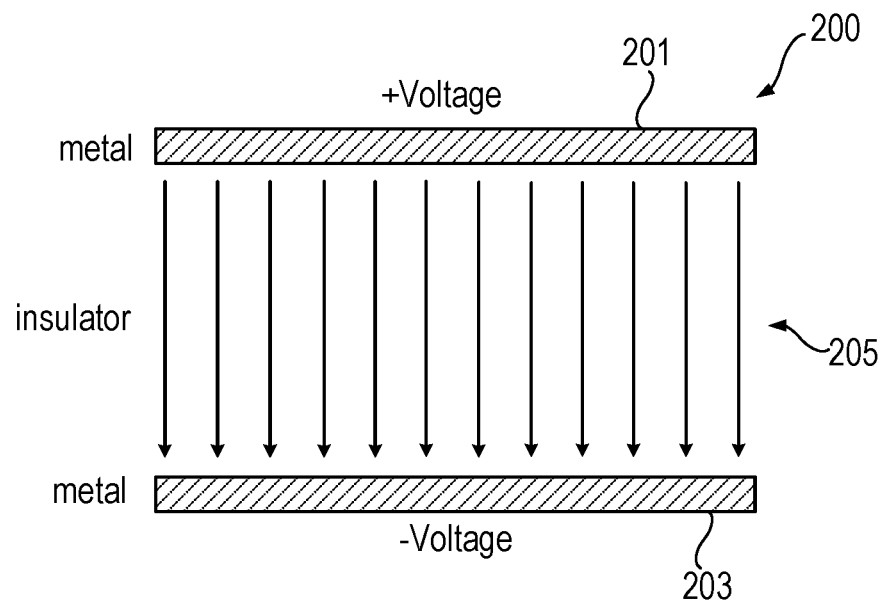
FIG. 2 illustrates simplified electric fields in a cross section of a parallel plate capacitor.

FIG. 2 illustrates a simplified model of electric fields in a cross section of a parallel plate capacitor 200. The parallel plate capacitor includes a top metal plate 201 and a bottom metal plate 203. Field lines 205 extend through the insulating material from the top metal plate to the bottom metal plate. The conventional parallel plate capacitor equation is $C=\varepsilon_o \times k \times A/d$, where $\varepsilon_o$ is permittivity of free space, k is material relative permittivity (written sometimes as $\varepsilon_1$), A is plate area, and d is the spacing between the top plate 201 and the bottom plate 203. The electric field E=V/d, where d is the spacing between plates and V is the applied voltage. The simple capacitor equation shows a uniform field between the plates as a result of an applied voltage. The uniform field is shown as evenly spaced field lines 205 to represent the E-field. However, this uniform field would only exist in an infinitely wide structure. In actuality, the electric field at the edges is higher, and at sharp metal corners, the field can be infinitely high.

Figure 3:
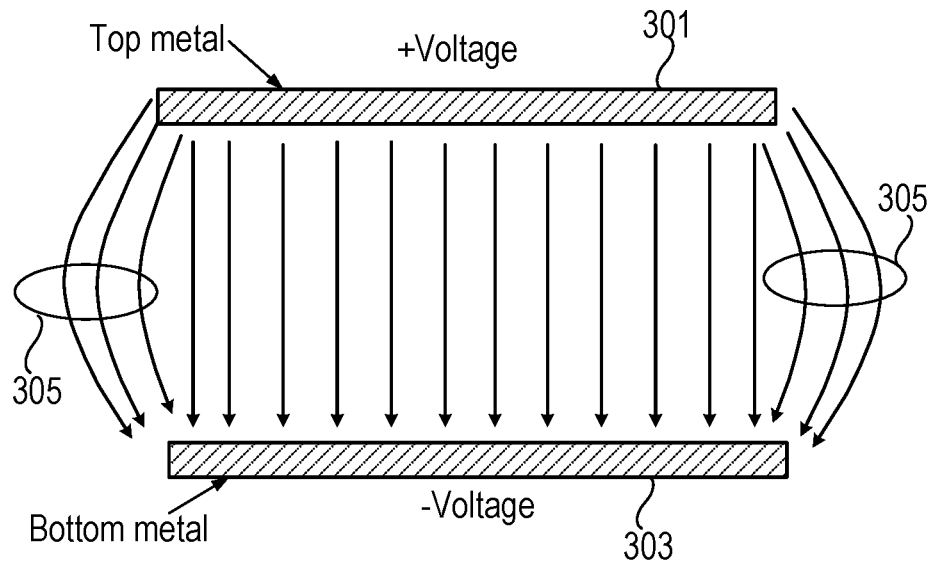
FIG. 3 illustrates fringe fields associated with a finite width parallel plate capacitor.

Referring to FIG. 3, rather than a uniform electric field as shown in FIG. 2, a finite width parallel plate capacitor has fringe fields extending from the plate 301 to plate 303 as shown by the field arrows 305. The fringe fields cause a field increase at plate corners as shown by the increased number of field lines that terminate near the corners of the capacitor plates. While theory says that an infinite field exists at a sharp corner, in reality, materials would breakdown in an infinite field. One approach to avoiding peak fields at corners would be to round the metal edge if the technology permits. However, rounding the edges of the metal plate is not practical in integrated circuit manufacturing. For lower voltage polysilicon gates beveling is used to reduce the peak fields, but this is not practical for the oxide thickness used for the isolation capacitors.

Figure 4:
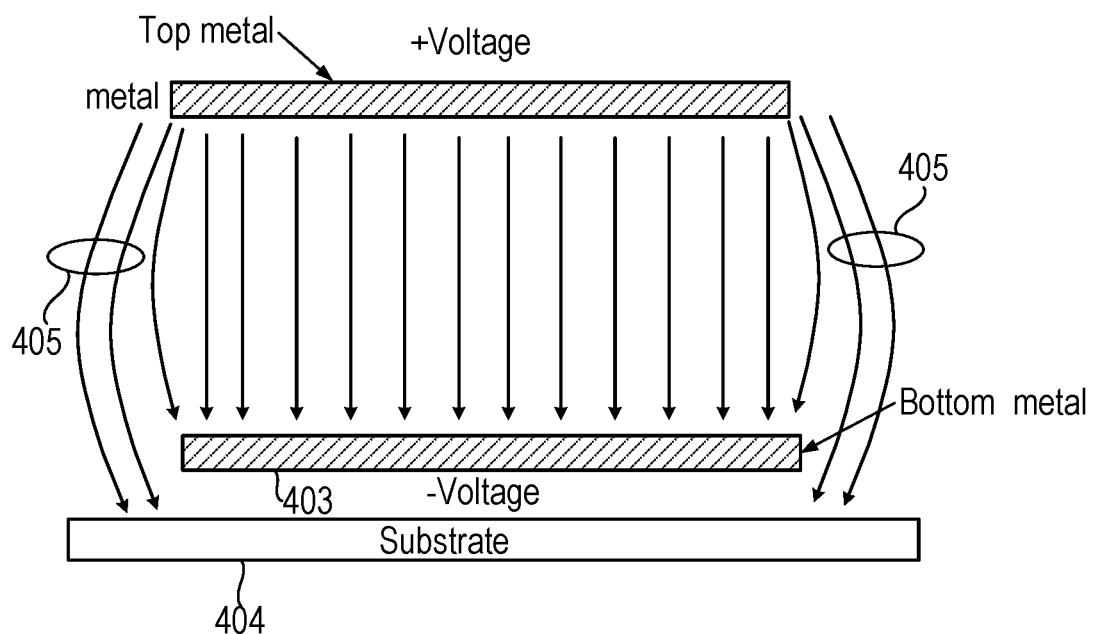
FIG. 4 illustrates field lines terminating at the substrate when the bottom plate is built over the substrate and is at a similar potential.

Referring to the capacitor structure shown in FIG. 4, the bottom plate 403 is built over a substrate 404 and the bottom plate 403 is at a similar potential to the substrate 404, e.g., close to ground. As a result, some field lines 405 from the top plate 401 terminate at the substrate. That results in the field not increasing as much at the plate edges on the bottom plate as compared to the bottom edge of the top plate.

As explained further herein, limiting the field at the edges of the plates is beneficial for both the bottom and top plate, but if the field is more intense at the edge of the top plate than the bottom plate, it is more important to mitigate a high field at the edges of the top plate.

Figure 5:
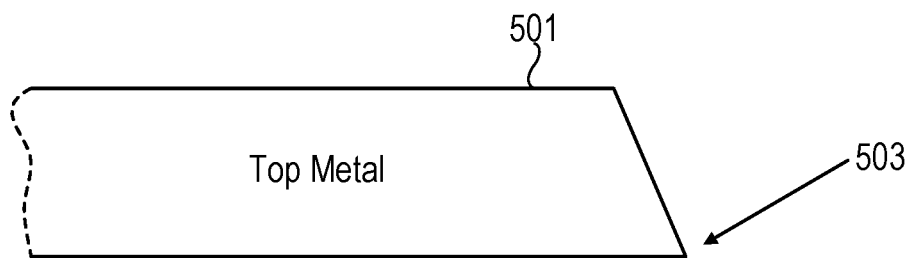
FIG. 5 shows a cross section of a metal plate with a trapezoidal structure.

FIG. 5 shows a cross section through a typical thick metal layer used as a top plate 501. As can be seen, the metal plate cross section often has a trapezoidal shape as a result of processing rather than being strictly rectangular. The trapezoidal shape includes a sharp angle at 503, which will result in very high fields at the corner location 503 and along the entire perimeter of the edge of the top metal plate. Mitigating the effects of very high fields in structures with sharp edges will improve the reliability of integrated circuits with isolation capacitors.

Figure 6:
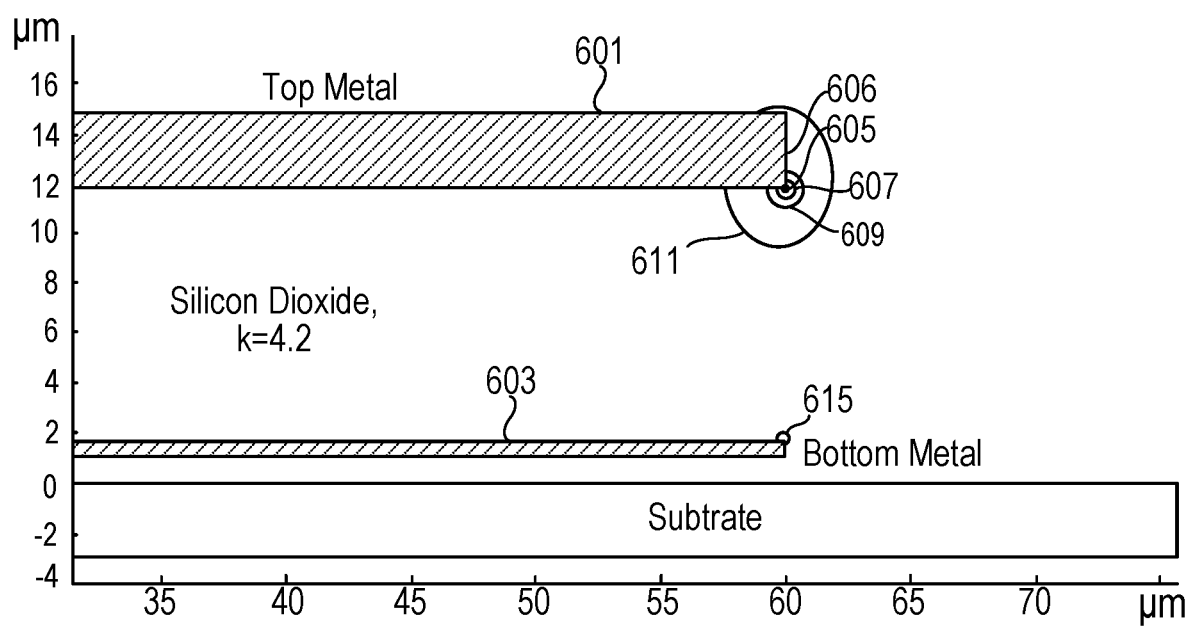
FIG. 6 illustrates field simulation results for a typical capacitor structure showing high fields at the edge of the top metal plate.

FIG. 6 illustrates simulation results showing the field for a capacitor structure similar to the capacitor structure of FIG. 1. The capacitor structure includes the top metal plate 601 and the bottom metal plate 603. The plates simulated are circular with the top and bottom cross sections shown in FIG. 6 rotated around the Y axis. The top metal plate 601 is approximately 3 microns thick and has a 120 micron diameter and the bottom plate is approximately a half micron thick. The dielectric material is selected to have a dielectric constant of SiO2=k=4.2. The dielectric structure between the plates is approximately 10 microns thick and a voltage of 5000 V is applied across the top and bottom plates. The resulting maximum field is approximately 4.65 kV/μm at the bottom corner 605 of the edge 606 of the top metal plate. The field spreads out from that corner in a gradient. The field between the peak field and contour line 607 ranges from about 1.2 kV/μm beyond the high field at 605 to about 1.0 kV/μm at the contour line 607. The field between contour line 607 and contour line 609 ranges between about 1.0 kV/μm and 0.8 kV/μm. Finally, the field between the contour line 609 and the contour line 611 is between approximately 0.8 kV/μm and 0.6 kV/μm. Note that the contour lines approximate the simulation results. The field between the plates is largely uniform at approximately 0.5 kV/μm as expected by the voltage and separation. The field to the right of the plates is approximately 0 kV/um past 65 microns (to the right of the edge of the plates). A slight increase in field occurs at the corner 615 of the bottom plate to approximately 0.875 kV/μm but note that the field is in a very small area compared to the top field. The highest peak field has an approximately 0.5 micron radius around the corner, at a field strength of approximately 4.65 kV/μm, which is four times higher than the breakdown voltage of SiO2 of 1000 V/μm. A failure in the SiO2 in this region would then propagate in the direction of the field lines towards the bottom plate.

Figure 7:
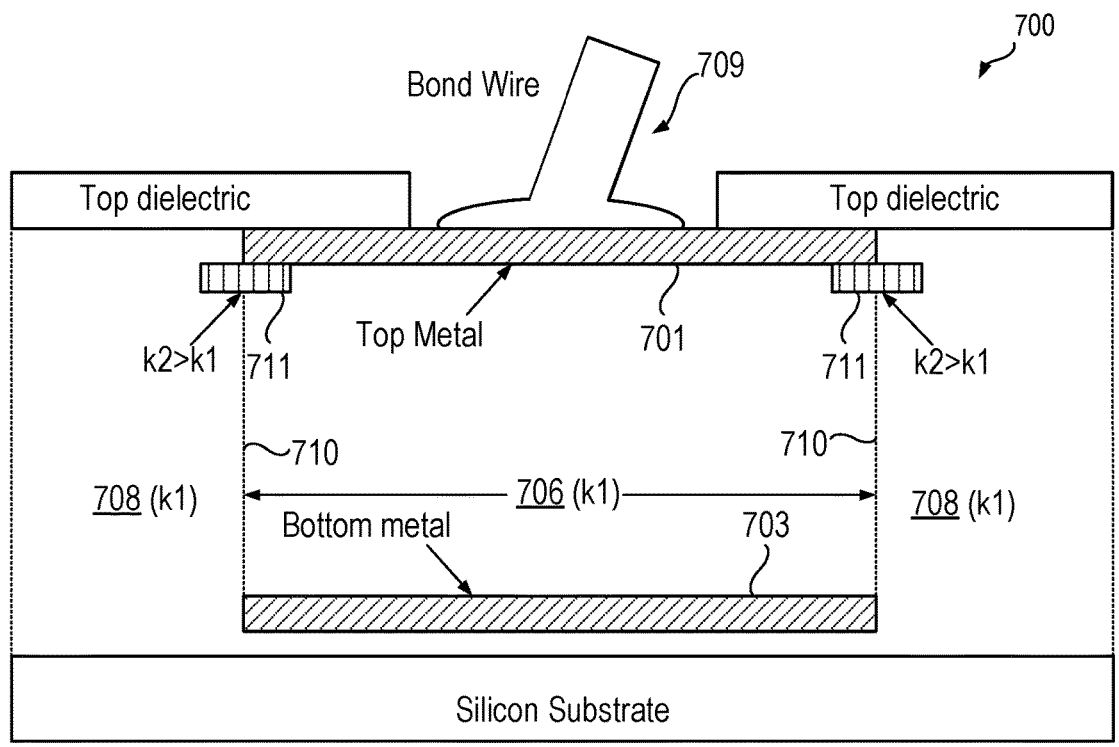
FIG. 7 illustrates an embodiment that reduces the effects of high field by adding a high dielectric constant material at the location of the peak fields.

In order to reduce the risk of failure resulting from high fields around the edge of the top metal plate of a capacitor, an embodiment adds a high dielectric constant (k) material at the location of the peak fields. FIG. 7 illustrates one such embodiment. The capacitor structure 700 includes a top metal plate 701 and a bottom metal plate 703 and a dielectric layer including a region of dielectric 706 between lines 710 having a dielectric constant of k1. The region of dielectric 706 extends from under the top metal plate to the bottom metal plate 703. In an embodiment, the region of dielectric 706 is formed by SiO2. The SiO2 dielectric layer is also in regions 708 and 710 outside of the edges of the metal plates, which regions are typically formed at the same time in the manufacturing process as dielectric region 706. Dielectric material is also between the bottom metal plate and the silicon substrate. The embodiment shown in FIG. 7 includes a protection layer of higher-k material in a thin narrow ring that follows the shape of the edge of the top metal plate. The ring of dielectric material 711 has a dielectric constant k2 and k2>k1. In an embodiment the ring is formed of silicon nitride, which has excellent strength under high fields. As shown in FIG. 7 the ring structure has a first portion underneath the top metal layer and another portion of the ring structure in the dielectric regions 708. While some embodiments may use a single material for the high-k ring, other embodiments use multiple high-k materials. Thus, in embodiments the ring structure is built with several layers of different high-k materials using the same or a similar mask. Each layer of the ring is preferably less than 1.2 microns in thickness but thicker layers could also be used.

The ring structure adds a high dielectric constant material (k2) at the location of the peak fields. As can be shown by a series capacitance model, the use of the dielectric material with k2>k1 reduces the voltage drop across this material, and as a result reduces the size of the high field regions. That is similar to the way that a lens can shape or focus light, which is also determined by the dielectric constant of the lens. If the high dielectric material is able to withstand the high fields better than the SiO2, a higher overall breakdown strength can be achieved.

Some materials, such as silicon nitride have excellent strength under high fields. Silicon nitride is a very durable (used as high strength bearings for example) thereby preventing catastrophic failure at high fields. SiN has a higher dielectric constant (7.2) than SiO2 (4.2). Contaminants at the surface such as sodium or hydrogen contribute to failure at high fields and can move through silicon dioxide more easily than through silicon nitride. Thus, SiN is better at mobile ion protection than SiO2 and the mechanical strength of SiN is better than SiO2. SiN has a comparable breakdown strength to SiO2 at 1000 V/μm but is better at tolerating high fields. SiO2 has deep charge traps. Therefore charges cannot move in response to the high fields, until the fields are so high that it damages the SiO2 when charges finally move in it. SiN and other materials have shallow traps. So although materials such as SiN are higher k dielectrics, under high fields the charges can move more easily. The charges that move have the effect of reducing the field locally. So the regions of high field, being contained in the SiN, are also more likely to be reduced by the shallow charge traps and movement of charge to cancel out these peak fields.

While SiN has good strength, it cannot be built as thick layers. Thick layers of SiN can adversely affect the base integrated circuit structure due to high compressive or tensile strength. Thus, SiN's mechanical properties can put stress on the oxide and/or silicon wafer, so using it only at the location of high field where it is needed, helps ensure best mechanical properties for both the capacitor plate above the thin ring, the bond wire 709, and the overall integrated circuit wafer. The bond pad structure (the exposed top metal plate) to which the bond wire attaches still resides on SiO2, meaning the top metal bonding design does not have to change as the exposed bond pad structure (the top metal plate) remains above silicon dioxide. If instead of a ring structure, a solid layer of SiN was used beneath the top metal plate where the bond wire attaches, different mechanical qualities of SiN as compared to SiO2 could impact the design of the top metal plate and and attachment of bond wire 709. By using a ring structure, the bond pad and bond wire remain unaffected and mechanical stress is not significantly changed for the integrated circuit structure.

While SiN is one material suitable for use for the higher k ring structure, other materials may also be used. For example, in an embodiment the ring structure uses aluminum oxide as the high k material. Another embodiment uses an $Si_xON_y$ material tailored for the higher k ring structure according to the particular application and process. Still other embodiments use silicon rich oxide (SRO) as the high-k dielectric. A ring structure with multiple layers of different dielectric materials use these or other suitable dielectric materials for each layer.

Figure 8A:
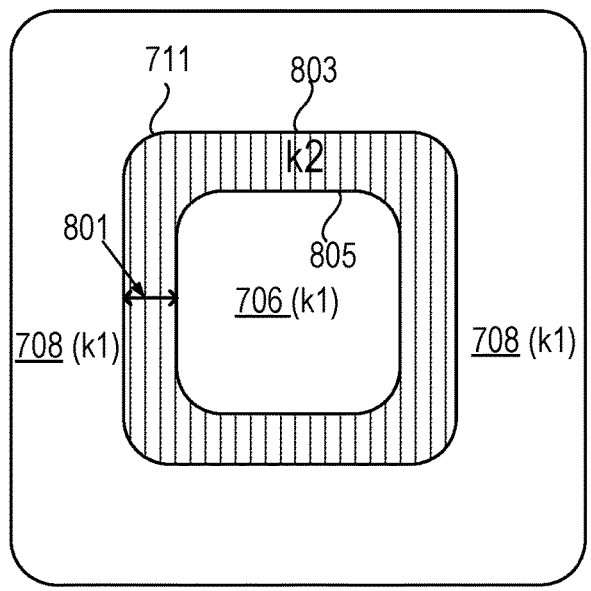
FIG. 8A illustrates a top view of an embodiment of the ring structure with the high dielectric constant material that is placed at the location of the peak fields.

FIG. 8A illustrates a top view of an embodiment of the ring structure 711 without the metal plate. The ring structure 711 has a ring width 801 between the outer perimeter 803 of the ring and the inner perimeter 805 of the ring. The dielectric region 706 can be seen adjacent to the inner perimeter of the ring structure and the dielectric region 708 is adjacent to the outer perimeter of the ring structure.

The shape of the metal plate and the ring structure varies in different embodiments. For a round metal plate, the protection layer of high-k material is a thin, narrow width circular ring. For other metal plate shapes (e.g., square, oval, combination) the protective ring structure follows the shape of the metal plate edge as, e.g., a thin, narrow square, oval, combination, or other-shaped ring. For example, in an embodiment the top metal plate is rectangular in which case the ring structure is a rectangular ring following the edge of the metal plate. In another embodiment, the top metal plate is a rectangle with rounded corners in which case the ring structure is a rounded rectangle. However, the ring structure does not have to exactly follow the shape of the top metal plate as long as there is sufficient overlap between the top metal plate and the ring structure and the ring structure extends beyond the edge of the metal plate a sufficient distance to reduce the size of the high electric field and reduce the field in the SiO2. Thus, e.g., the metal plate may be a rounded square while the ring structure is a square, or vice versa. Thus, the protective ring is the appropriate shape to follow the edge of the metal plate.

Figure 8B:
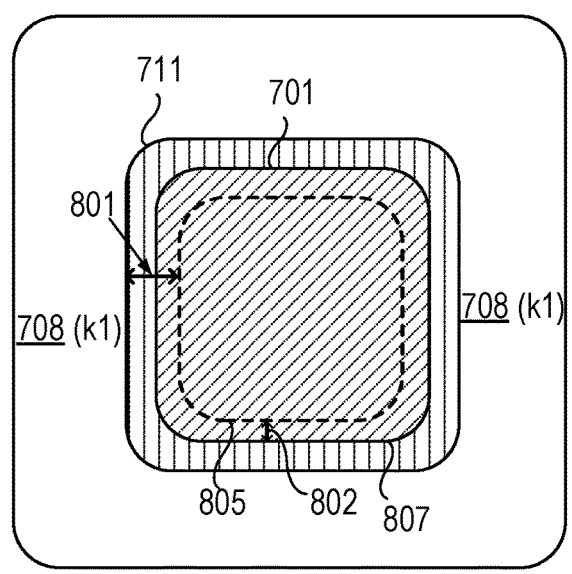
FIG. 8B illustrates a top view of an embodiment of the ring structure with the high dielectric constant material that is placed at the location of the peak fields and the top metal plate.

FIG. 8B illustrates a top view of the metal plate 701 and the ring structure 711 with the width 801 and the dielectric region 708 adjacent to the outer perimeter of the ring structure. Note that the width of the ring structure is exaggerated in FIGS. 8A and 8B. A typical width of the ring structure is 5-40 microns depending on the process technology, while the width of the top metal plate is typically greater than 100 microns. But the width of the ring and the width of the top and bottom metal plates in any particular embodiment varies according to process technology and design goals. The overlap region 802 between the inner perimeter 805 of the ring structure and the plate edge 807 shows that a portion of the ring structure overlaps the metal plate and a portion of the ring structure extends outside the edge of the metal plate. In embodiments, the overlap region and the region outside the edge of the metal plate is split equally, e.g., 5 microns of the ring width is under the metal plate and 5 microns of the ring width is outside of the top metal plate edge. Field simulations show the dimensions needed to be effective. Simulations show that a ring structure with a thickness of 0.7 μm and a width of 10 μm was effective at mitigating the effects of high fields. However, the dimensions needed to be effective may be less, e.g., only 2-3 microns of the ring structure needs to be outside the edge of the top metal plate to effectively reduce field size but process technology may require a wider ring structure than 5 or 6 microns and thus manufacturer limits, e.g., requiring 5-40 microns for the width of the ring structure can be a factor in choosing the dimensions of the ring. While some embodiments utilize a ring thickness of 0.7 μm, other embodiments use different thicknesses, e.g., between 0.5 μm and 1.2 μm. The thickness of each ring layer can be higher or lower depending, e.g., on the process capability of the fabrication facility and product design requirements but the thickness has to be sufficient for the ring to be present at the location of high fields. Note that the top and bottom metal plates can be formed of copper, aluminum, or any metal or metal alloy suitable in semiconductor processing.

Figure 9:
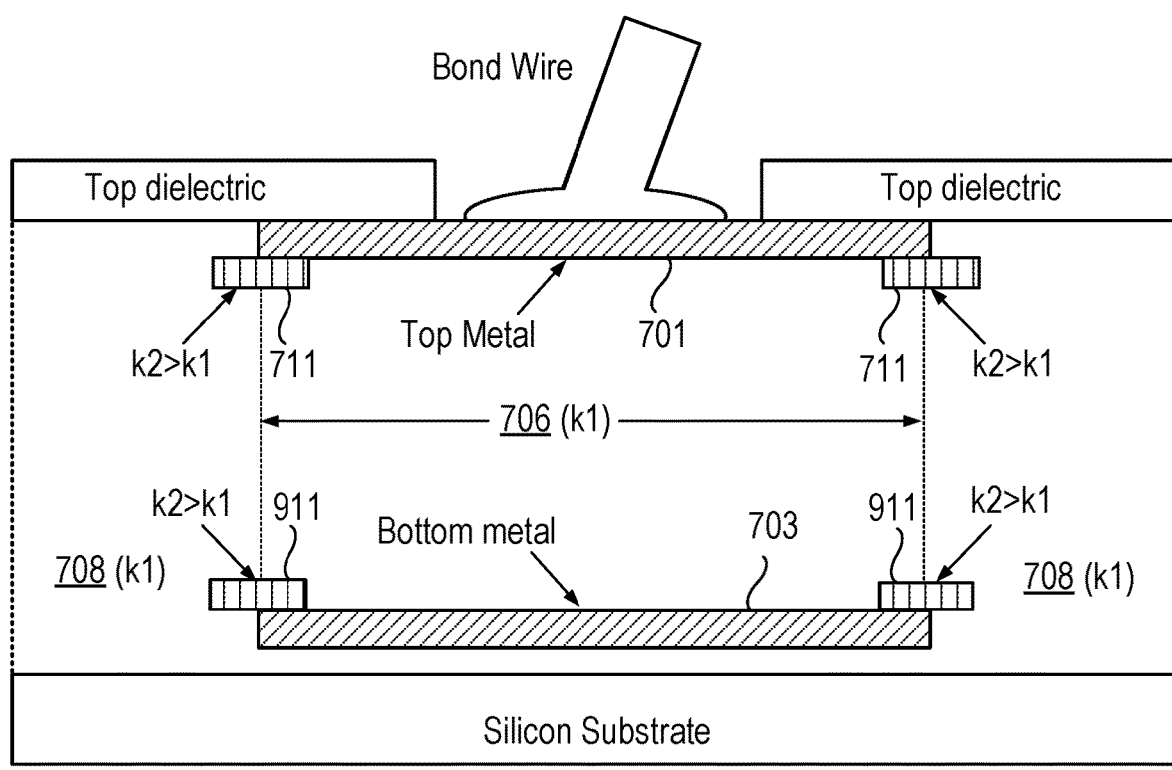
FIG. 9 illustrates an embodiment in which a second ring structure is formed above the bottom metal plate.

FIG. 9 illustrates another embodiment in which a second ring structure 911 is formed above the bottom metal plate 703. The lower ring structure 911 may not be as critical as the top ring structure 711 but may be advantageous, particularly in embodiments in which the bottom metal plate is located at a significant distance from the substrate thereby concentrating more field lines at the top corner of the lower metal plate. The lower ring structure lowers the field seen in the SiO2 layer at the top corner of the bottom metal plate.

Figure 10:
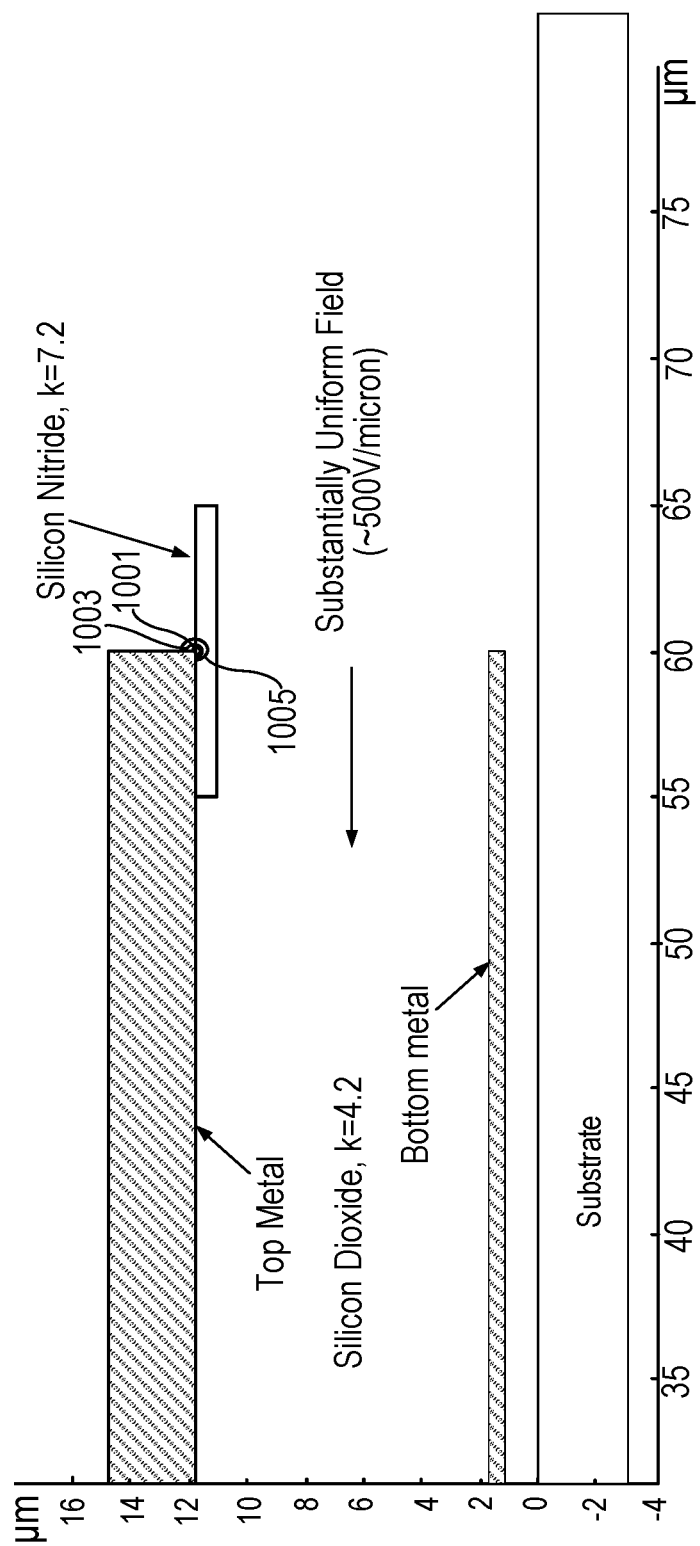
FIG. 10 shows a field simulation of a capacitor showing the effectiveness of the ring structure at reducing field size and therefore breakdown risk.

FIG. 10 illustrates a field simulation of the ring structure showing the effectiveness at reducing the size of the electric field at the bottom corner of the top metal plate 701 and reducing the field in the lower dielectric material (SiO2). The simulation uses an applied voltage of 5000V across the metal plates. Use of the ring structure reduces the physical size of the high field and significantly reduces the field in the SiO2 underneath the ring structure as compared to simulation without the ring structure.

Figure 11:
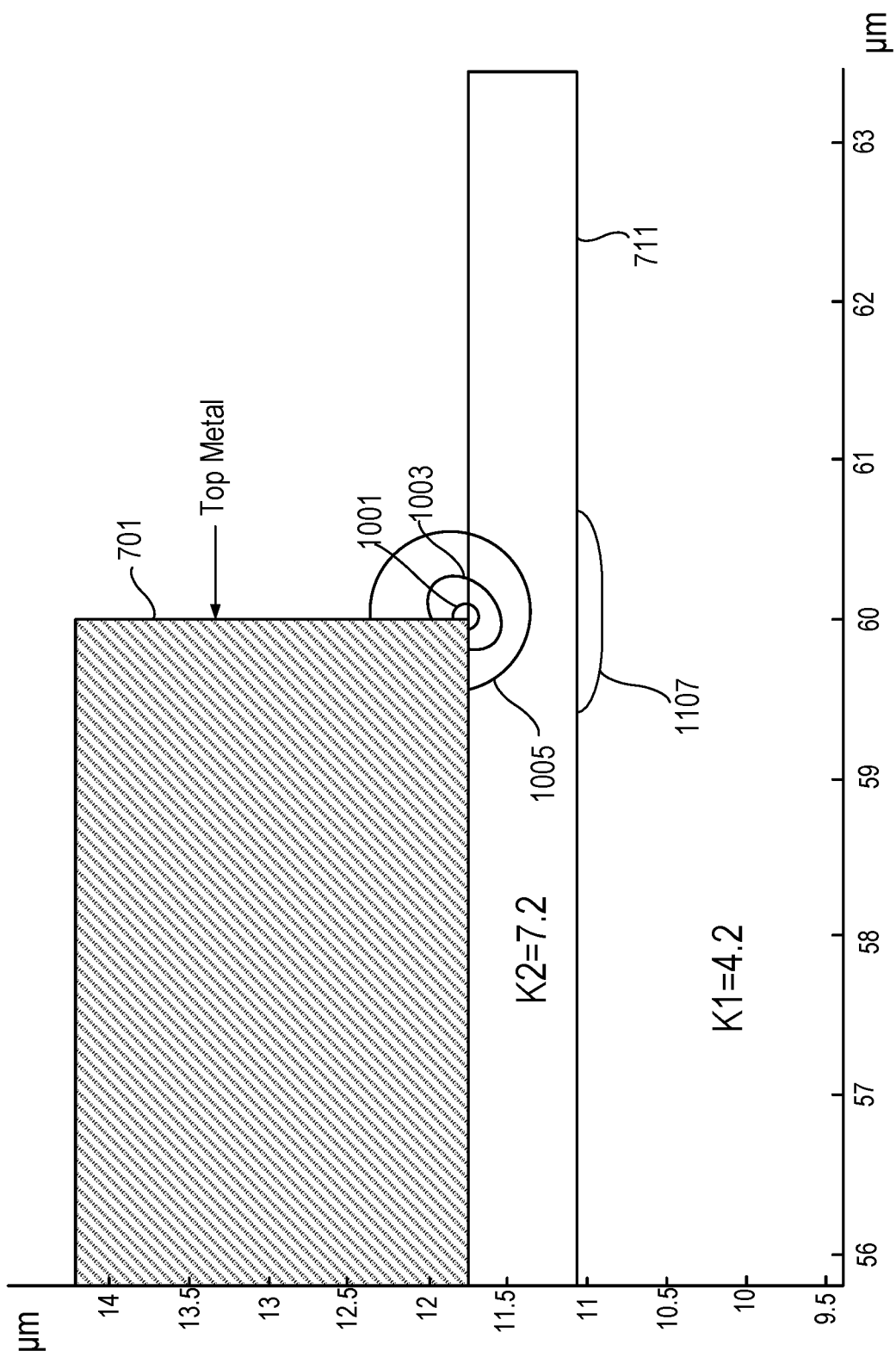
FIG. 11 shows a closer view of a field simulation showing the effectiveness of the ring structure at reducing breakdown risk.

In the simulation, k=4.2 (SiO2) for the oxide between the bottom metal plate 703 and the top metal plate 701. For the ring structure, k=7.2 (SiN). The ring structure has a width of 10 microns and a thickness of approximately 0.7 microns. As can be seen, the high peak field size at 1001 has been greatly reduced even though the peak field is still high (~7.1 kV/μm). The field strength between the peak field and contour line 1003 is between approximately 1.2 kV/μm and 1.0 kV/μm. The region between contour line 1003 and contour line 1005 is approximately 0.9 kV/μm. As compared to the field sizes shown in FIG. 6, the E-field is significantly reduced and much weaker field strength is present in the SiO2. The high fields are contained in the ring structure. The field between the two plates is a constant field of approximately 500 V/μm. FIG. 11 shows a closer view of the fields with contour lines 1001, 1003, and 1005. A small area of increase field 1107 occurs in SiO2 but at its peak is approximately 0.9 kV/μm, which is less than the breakdown voltage of SiO2. The highest peak field has an approximately 0.2 micron radius around the corner, at a field strength of approximately 7.1 kV/μm. The contour lines in FIGS. 10 and 11 approximate the simulation results. That radius is less than half the size of the peak field without the ring structure. Although the peak field is high, the ring structure is better able to withstand the field stress even if the high field causes a breakdown in the SiN ring, so the failure will not propagate to the SiO2 layer.

Figure 12:
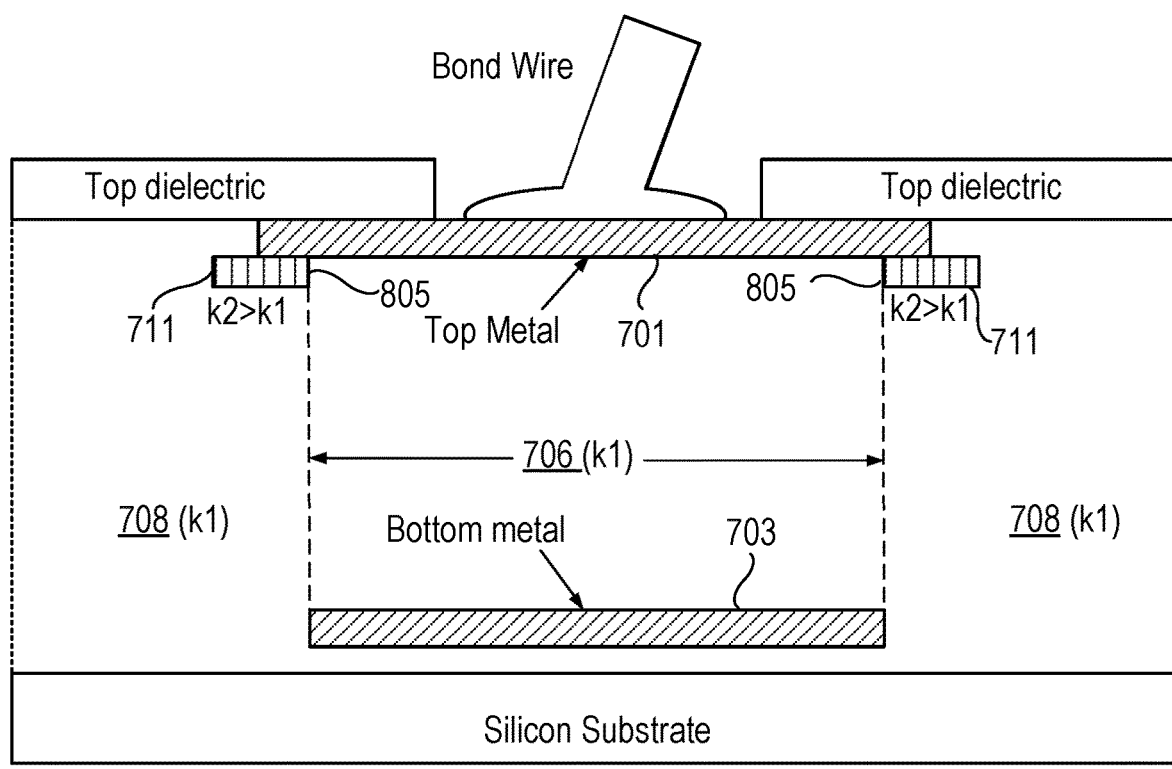
FIG. 12 illustrates an embodiment in which the top metal plate is larger than the bottom metal plate.

FIG. 12 illustrates an embodiment in which the top metal plate 701 and the bottom metal plate 703 are of different sizes. In the embodiment of FIG. 10, the edge of the bottom metal plate 703 is aligned with or inside the inner perimeter of the ring structure 711. Because of the proximity to the substrate, peak fields on the bottom metal plate are lower as previously discussed. Reducing the size of the bottom metal plate does slightly increase these fields. But a smaller plate also means that other structures or even circuitry can get closer to the bottom plate, especially since the bottom plate and circuitry are at approximately the same potential. For example, a metal 1 keep out ring to isolate the capacitor can be placed 20 um from the bottom plate, after which circuitry will occupy the space.

Figure 13:
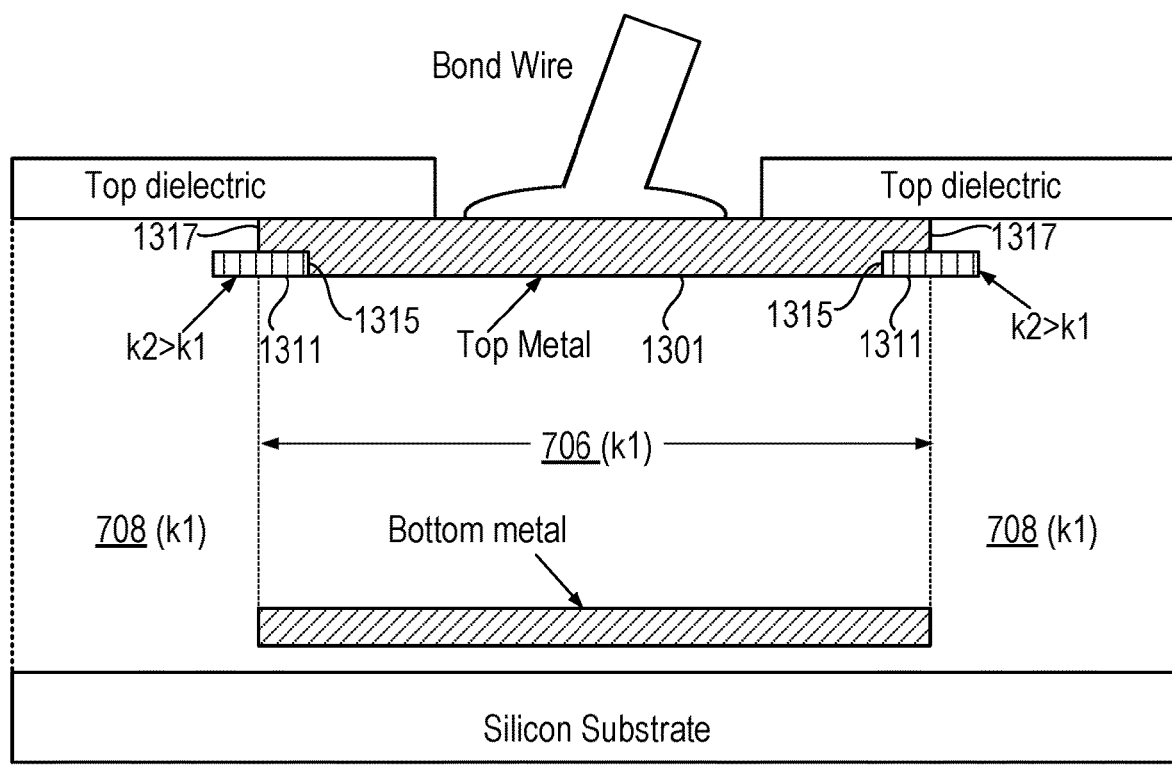
FIG. 13 shows another embodiment in which the ring structure is laterally adjacent to a lower portion of the top metal plate.

FIG. 13 shows another embodiment providing the ring structure. Rather than having the ring structure entirely underneath the top metal plate 1301, the ring structure 1311 is laterally adjacent to a portion of the top metal plate. Thus, the high-k layer of, e.g., SiN is deposited and the inner portion of the SiN layer is etched away to form the ring structure. Metal is formed after the etching process and assuming no oxide was filled in the etched area, the top metal plate 1301 has a step at 1315. Similar to the bottom plate over a similar potential substrate, the fields are not high at this step 1315. The edge of the metal plate extending beyond this internal edge still functions as the location of termination of the field lines, and the peak fields remain at the bottom corner of the external edge 1317, which is above the top surface of the ring structure 1311.

Figure 14:
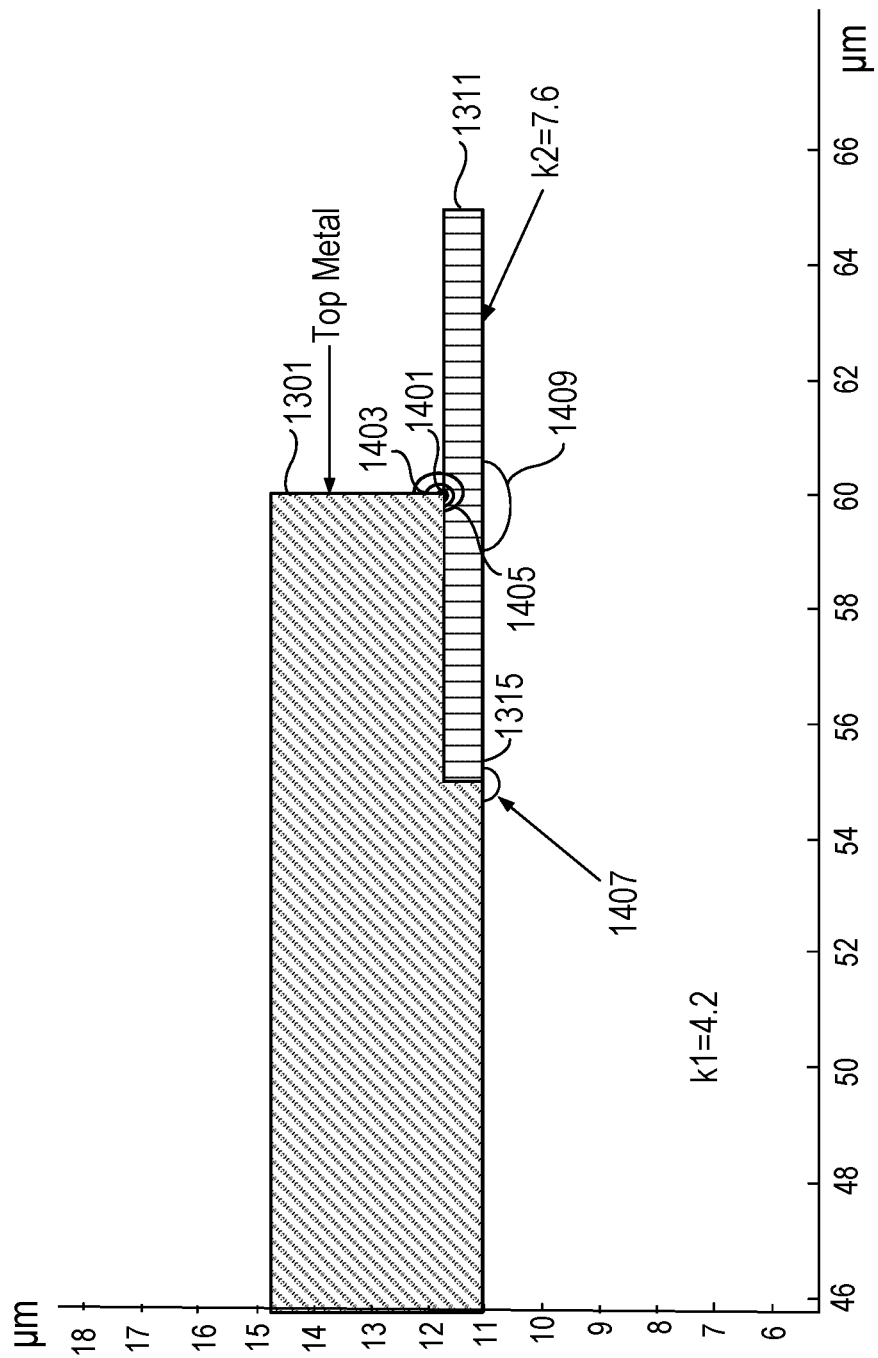
FIG. 14 illustrates simulation results for the structure in which the ring structure is laterally adjacent to a lower portion of the top metal plate.

FIG. 14 illustrates simulation results for a structure similar to that shown in FIG. 13. The field size is similar to the embodiment when the ring structure is below the bottom surface of the top metal plate as shown in FIG. 7 and the counter lines 1401, 1403, and 1405 are similar to the contour lines in FIG. 11. Thus, the high peak field size at 1401 has been greatly reduced compared to no ring structure even though the peak field is high (~7.1 kV/μm). The field strength between the peak field and contour line 1403 is between approximately 1.2 kV/μm and 1.0 kV/μm. The region between contour line 1403 and contour line 1405 is approximately 0.9 kV/μm. Note that only a small field 1407 appears at the bottom corner of the step 1315. The small field 1407 is above the average field between the top and bottom plates but the field size is small and well below breakdown voltage. A small field 1409 appears in the SiO2 but the field strength is below the breakdown voltage for SiO2. The contour lines approximate the simulation results. Thus, constructing the ring structure such that its inside perimeter is adjacent to metal provides good performance and may provide easier and less expensive fabrication.

Thus, various aspects have been described related to an isolation capacitor structure with a ring structure that reduces risk of capacitor breakdown under high voltages. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. An integrated circuit comprising:
    a bottom conductive plate;
    a top conductive plate;
    a first dielectric region formed from a first dielectric material, a first portion of the first dielectric region being between the top conductive plate and the bottom conductive plate;
    a second dielectric region that includes a second dielectric material having a higher dielectric constant than the first dielectric material, the second dielectric region having an inner portion below a portion of the top conductive plate and an outer portion extending beyond an edge of the top conductive plate; and
    a third dielectric region that includes the second dielectric material, the third dielectric region having an inner portion above a portion of the bottom conductive plate and an outer portion extending beyond an outer edge of the bottom conductive plate.

2. The integrated circuit as recited in claim 1 wherein an inner perimeter of the second dielectric region is laterally adjacent to a portion of the top conductive plate and an outer perimeter of the second dielectric region is laterally adjacent to a second portion of the first dielectric region.

3. The integrated circuit as recited in claim 1 wherein a portion of a top of the second dielectric region is adjacent to a portion of a bottom of the top conductive plate.

4. The integrated circuit as recited in claim 1 wherein an inner perimeter of the second dielectric region is laterally adjacent to a portion of the first dielectric region underneath the top conductive plate.

5. The integrated circuit as recited in claim 1 wherein the second dielectric region includes the second dielectric material and at least another dielectric material.

6. The integrated circuit as recited in claim 1 wherein the bottom conductive plate is smaller than the top conductive plate.

7. The integrated circuit as recited in claim 1 wherein an outer edge of the bottom conductive plate does not extend past an inner perimeter of the second dielectric region.

8. The integrated circuit of claim 1 wherein a portion of the top conductive plate forms a bond pad structure.

9. A method of making an integrated circuit comprising:
    forming a bottom conductive plate;

forming a first dielectric region of at least a first dielectric material, a first portion of the first dielectric region being formed above the bottom conductive plate;

forming a second dielectric region having an inner perimeter and an outer perimeter, the second dielectric region being formed above the first portion of the first dielectric region, the second dielectric region including at least a second dielectric material, the second dielectric material having a higher dielectric constant than the first dielectric material; and forming a top conductive plate such that an outer portion of the second dielectric region extends beyond an edge of the top conductive plate and an inner portion of the top conductive plate is above and adjacent to an inner portion of the second dielectric region; and forming a third dielectric region that includes the second dielectric material, the third dielectric region having a second inner perimeter and a second outer perimeter, a portion of a bottom surface of the third dielectric region being formed adjacent to a top surface of the bottom conductive plate.

10. The method as recited in claim 9 further comprising forming the top conductive plate such that a bottom surface of the top conductive plate is above the second dielectric region.

11. The method as recited in claim 10 further comprising forming the inner perimeter of the second dielectric region to be laterally adjacent to a portion of the first dielectric region underneath the top conductive plate.

12. The method as recited in claim 9 further comprising forming the inner perimeter of the second dielectric region to be laterally adjacent to a portion of the top conductive plate.

13. The method as recited in claim 9 further comprising forming the second dielectric region to have at least two dielectric materials including the second dielectric material.

14. The method as recited in claim 9 further comprising forming the bottom conductive plate to be smaller than the top conductive plate.

15. The method as receited in claim 9 wherein further comprising attaching a bonding wire to an exposed portion of the top conductive plate that forms a bond pad structure.

16. A method of making an integrated circuit comprising:
forming a bottom conductive plate;

forming a first dielectric region of at least a first dielectric material, a first portion of the first dielectric region being formed above the bottom conductive plate;

forming a second dielectric region having an inner perimeter and an outer perimeter, the second dielectric region being formed above the first portion of the first dielectric region, the second dielectric region including at least a second dielectric material, the second dielectric material having a higher dielectric constant than the first dielectric material; and forming a top conductive plate such that an outer portion of the second dielectric region extends beyond an edge of the top conductive plate and an inner portion of the top conductive plate is above and adjacent to an inner portion of the second dielectric region;

forming a layer that includes the second dielectric material above the first dielectric region;

removing a first portion of the layer to form the second dielectric region; and forming the top conductive plate with a portion of the top conductive plate being formed in a region where the first portion of the layer was removed.

17. The method as recited in claim 16 further comprising forming a third dielectric region that includes the second dielectric material, the third dielectric region having a second inner perimeter and a second outer perimeter, a portion of a bottom surface of the third dielectric region being formed adjacent to a top surface of the bottom conductive plate.

18. The method as recited in claim 16 further comprising forming the second dielectric region to have at least two dielectric materials including the second dielectric material.

19. The method as recited in claim 16 further comprising forming the bottom conductive plate to be smaller than the top conductive plate.

\* \* \* \* \*